United States Patent
Hanajima

(10) Patent No.: US 6,414,507 B1
(45) Date of Patent: Jul. 2, 2002

(54) DEVICE TESTING SYSTEM

(75) Inventor: Mitsutada Hanajima, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/516,867

(22) Filed: Mar. 2, 2000

(30) Foreign Application Priority Data

Mar. 9, 1999 (JP) ............................................ 11-062419

(51) Int. Cl.$^7$ .............................................. G01R 31/28
(52) U.S. Cl. .................................... 324/765; 324/158.1
(58) Field of Search ............................ 324/73.1, 158.1, 324/765, 763; 438/14, 17, 18; 714/738, 733, 734

(56) References Cited

U.S. PATENT DOCUMENTS 5,321,354 A * 6/1994 Ooshima et al. ......... 324/158.1
5,949,798 A    9/1999 Sakaguchi

FOREIGN PATENT DOCUMENTS

| JP | 9-211088 | 8/1997 |
|----|----------|--------|
| JP | 2000-65890 | 3/2000 |

* cited by examiner

*Primary Examiner*—Vinh P. Nguyen
(74) *Attorney, Agent, or Firm*—Fish & Richardson PC

(57) ABSTRACT

A pattern generator repetitively supplies the same test pattern to a DUT via a driver, and a signal converter converts the obtained source current value into a digital signal that it transmits to an averaging processor. Thereafter, the averaging processor adds together source current signals corresponding to the test patterns for each application and obtains an average for them. Then, a signal analyzer converts the averaged current signal, from which fluctuation has been eliminated, into a spectrum that, to detect failure, a comparison determination circuit compares with comparison data stored in a memory. For this process, a plurality of like test patterns are linked together and supplied to a DUT, and a source current signal is generated by using the linked patterns and is converted into a spectrum that is employed to detect a failure.

6 Claims, 4 Drawing Sheets

DEVICE TESTING SYSTEM

BACKGROUND OF THE INVENTION

The present invention relates to a device testing system used to detect and analyze a failure of a device that is being tested.

A device testing system used to detect and to analyze a failure of a DUT (Device Under Test: a general term for a device being tested), such as an LSI, conducts a test by converting a measured source current in the DUT into spectrum data and then analyzing the spectrum. According to this test, a predetermined test pattern is applied to the DUT, and the source current for the DUT obtained during the operation of the test pattern is converted into spectrum data. The thus obtained spectrum has a peak that is present only at integer times a basic frequency 1/T [Hz]; for example, when the period of time extending from the operational start of the test pattern to its end is defined as T seconds, the peak of the spectrum first appears at 1/T [Hz], and at 2/T [Hz], 3/T [Hz], . . . thereafter. Conventional art concerning such a device testing system is disclosed in, for example, the Unexamined Japanese Patent Application Publication No. Hei 9-211088.

While generally a device testing system can repetitively supply a test pattern, due to the effect produced by the structure of the measurement system, a source current having the same strength does not always flow across the DUT, even though the same test pattern is applied, and the strength of the source current more or less fluctuates. Especially when the DUT is a CMOS integrated circuit, substantially, no source current flows across the circuit when it is inactive, and the circuit is easily affected by slight current changes due to noise. Therefore, in a conventional device testing system that detects a failure by converting the source current of the DUT into spectrum data, there is a large variance in the measurement values.

When the source current of the DUT is converted into spectrum data, the spectrum generated is the result of the operating time required for one test pattern that is applied in the above described manner. Therefore, the precision of a failure detection process using the spectrum depends on the spectrum interval, which is consonant with the operating time for the test pattern. Thus, when the operating time is too short, a precise failure detection process can not be performed.

SUMMARY OF THE INVENTION

To resolve these shortcomings, it is one objective of the invention to provide a device testing system wherein variances in measurements can be reduced for the detection and the analyzation of failures experienced by DUTs, and wherein measurements using a fine source current spectrum are enabled in order to improve the rate of detection of DUT failures.

According to a first aspect of the invention, a device testing system comprises:

pattern supply means for supplying the same test pattern a plurality of times to a device being tested;

averaging means for measuring a source current for the device each time the test pattern is supplied, and for averaging the thus obtained values to provide an average source current measurement; and detection means for detecting a failure of the device based on the average source current provided by the averaging means.

According to a second aspect of the invention, in the device testing system in aspect 1, the detection means converts the average source current into a spectrum, and employs the spectrum to detect the failure of the device being tested.

According to a third aspect of the invention, a device testing system comprises:

pattern supplying means for supplying to a device being tested a plurality of like patterns that are linked together;

measurement means for measuring a source current for the device when the linked test patterns are supplied; and detection means for converting into a spectrum the source current measured by the measurement means, and for employing the spectrum to detect a failure in the device being tested.

According to a fourth aspect of the invention, in the device testing system in aspect 3 the pattern supplying means includes:

averaging means for supplying the linked test patterns to the device being tested, and for providing an average source current that is obtained by using the source currents that are measured by the measurement means when the test patterns are supplied. The detection means converts, into a spectrum, the average source current obtained by the averaging means, and employs the spectrum to detect a failure of the device being tested.

According to a fifth aspect of the invention, a device testing system, which is used to detect a failure of a device being tested, comprises:

a unit having a source current measurement function;

a unit for generating a test pattern and for controlling the test pattern;

a unit for converting, into spectral data, information for a source current for the device being tested; and an averaging circuit for repetitively applying the same test pattern to the device being tested and for averaging the source current obtained for the device.

According to a sixth aspect of the invention, the device testing system in aspect 5 further comprises: a function for converting, into spectral data, data obtained by the averaging circuit.

According to a seventh aspect of the invention, when employing the device testing system in aspect 5 or 6, a plurality of the same test patterns can be linked together and applied to the device being tested in order to detect a failure.

DETAILED DESCRIPTION OF THE PREFERRED EMBODIMENTS

<Arrangement>

Figure 1:
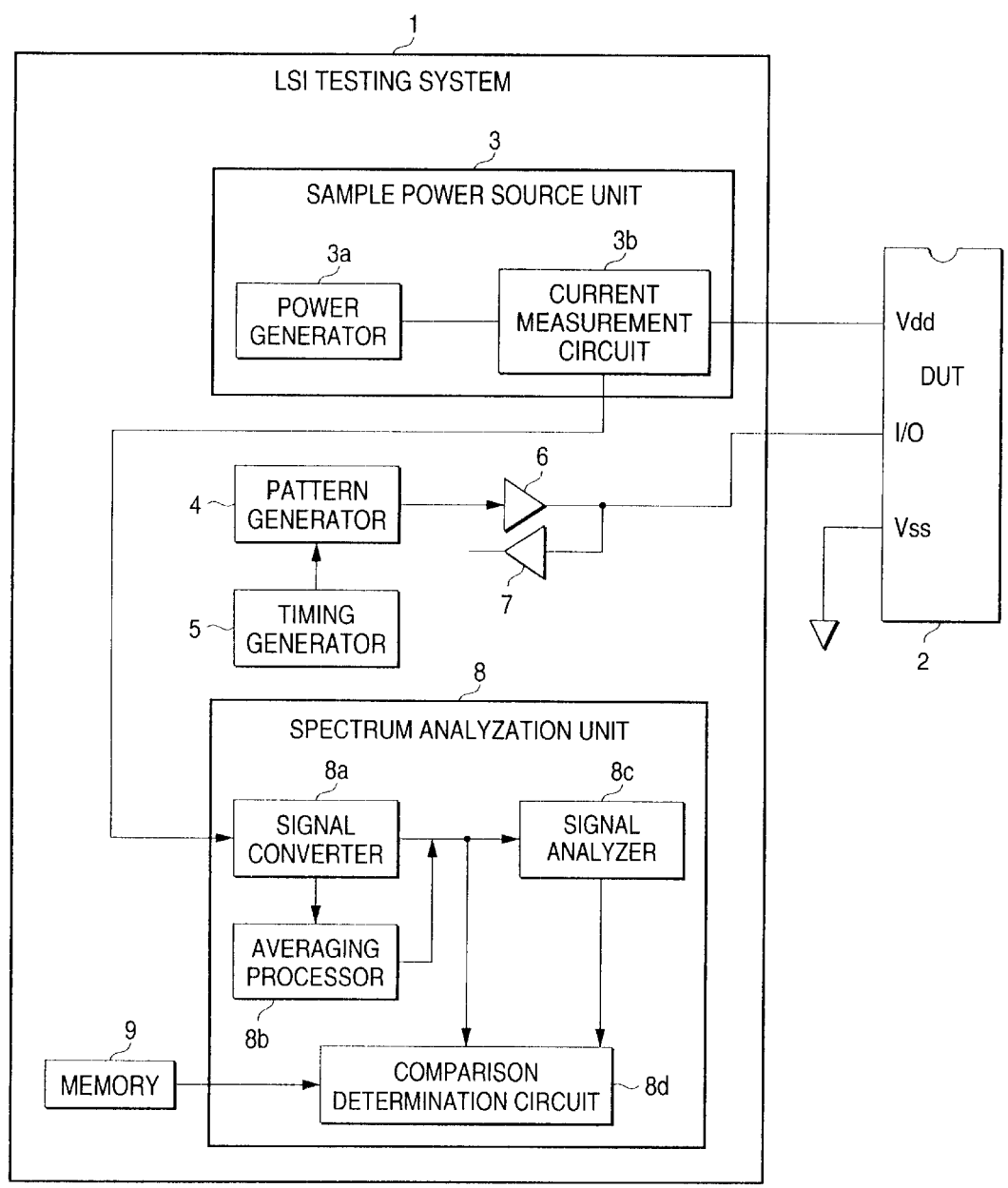
FIG. 1 is a block diagram illustrating an LSI testing system according to one embodiment of the present invention.

The preferred embodiment of the invention will now be described while referring to the drawings. FIG. 1 is a block diagram illustrating the arrangement of an LSI testing system 1 according to one embodiment of the invention.

In FIG. 1, the LSI testing system 1 supplies a source voltage and a predetermined test pattern to a DUT 2, and to detect a DUT 2 failure, measures the source current that is present. The DUT 2 is an LSI connected to the LSI testing system 1, which can be employed to test a variety of LSIs. It should be noted that the DUT terminal $V_{ss}$ is a negative source terminal that is grounded or connected to a predetermined negative potential terminal. The LSI testing system itself comprises the components described below.

A sample power source unit 3 is constituted by a power generation circuit 3a and a current measurement circuit 3b. The power generation circuit 3a generates a source voltage, at a predetermined level, that is supplied to the DUT 2. The output terminal of the circuit 3a is connected via the current measurement circuit 3b to power terminal $V_{dd}$ of the DUT 2, and the current measurement circuit 3b measures the current that flows between the two terminals. With this arrangement, the sample power source unit 3 has both a function for supplying a source voltage to the DUT 2 and a function for measuring the value (the analog value) of a source current transmitted along the power feeding connection line.

A pattern generator 4 has a function for repetitively generating the same test patterns that are linked together and a predetermined test pattern, which will be described later, that is generated for testing the DUT 2. A timing generator 5, which is connected via a driver 6 to the input/output terminal I/O of the DUT 2, controls the pattern generation timing and a test pattern signal, which is amplified to a predetermined level by the driver 6, that is transmitted to the DUT 2 input/output terminal I/O. A comparator 7 compares the test pattern signal and a signal output by the input/output terminal I/O, and employs the signal output by the DUT 2 to determine whether the DUT 2 is normal. The comparator 7 then transmits the results of the determination to specific output means or calculation means (neither of them is shown).

A spectrum analyzation unit 8 includes a signal converter 8a, an averaging processor 8b, a signal analyzer 8c and a comparison determination circuit 8d. The signal converter 8a, which is connected to the current measurement circuit 3b, receives an analog signal that represents the measured value of the source current, converts it into a digital signal, and transmits the digital signal to the averaging processor 8b, the signal analyzer 8c or the comparison determination circuit 8d. The averaging processor 8b, which is, for example, processing means constituted by an addition circuit and a division circuit, or carried out by a computation performed by a computer, averages digital signals (hereinafter referred to as source current signals) of source current values that are received from the signal converter 8a, and supplies the obtained source current signal to the signal analyzer 8c or to a comparison determination circuit 8d. The details of the performance of the averaging process by the averaging processor 8b will become apparent during the course of an explanation that will be given later.

The signal analyzer 8c converts, into spectrum data, a source current signal received from the signal converter 8a or the averaging processor 8b, and transmits the spectrum data to the comparison determination circuit 8d. The comparison determination circuit 8d then compares the source current signal, received from the signal converter 8a, the averaging processor 8b or the signal analyzer 8c, with comparison data stored in a memory 9, and in accordance with the comparison results, detects the occurrence of a failure in the DUT 2.

The memory 9 is storage means for previously recorded predetermined comparison data. The comparison data are constituted by a source current signal obtained when a normal LSI is employed as the DUT 2, and pertinent spectrum data (details of which will be described later). These comparison data are measured or theoretically calculated in advance and are stored in the memory 9.

<Processing>

The processing performed by the arrangement will now be described. Since the LSI testing system 1 that has the above arrangement can implement several failure detection modes, these modes will be explained in order.

Failure Detection Mode (1)

The supply of a source voltage from the power generator 3a is initiated, and the generation of a test pattern by the pattern generator 4 is also begun. As is shown by test pattern A in FIG. 2, for T seconds, test pattern TP is applied via the driver 6 to the input/output terminal I/O of the DUT 2. And at the same time, a source current for the DUT 2 is generated by the source current measurement circuit 3b, and the measured source current value is transmitted to the signal converter 8a to obtain a digital source current signal. The source current signal is then transmitted to the signal analyzer 8c, which subsequently converts the signal into spectrum data. Following this, the spectrum data are transmitted to the comparison determination circuit 8d.

Figure 2:
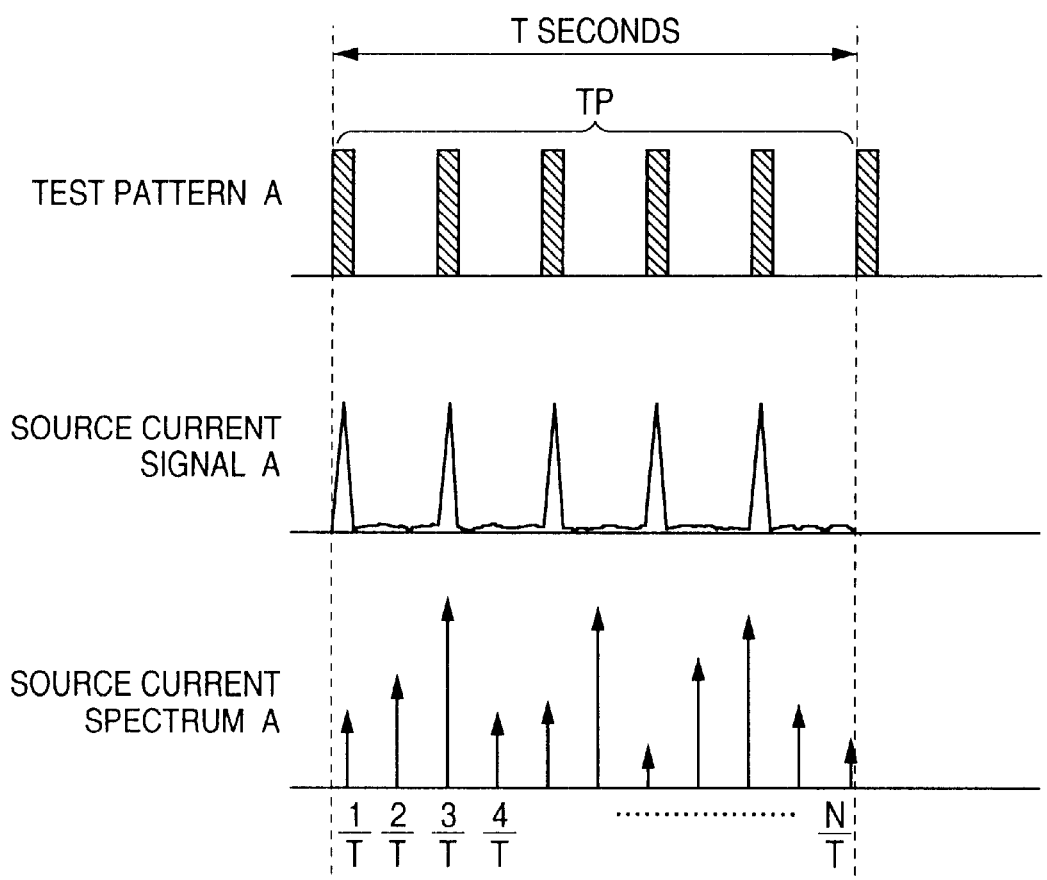
FIG. 2 is a diagram showing a test pattern to be supplied to a DUT by the LSI testing system, and a generated source current waveform for the DUT and its spectrum.

As a result, source current signal A in FIG. 2 is transmitted to the signal analyzer 8c, and source current spectrum A in FIG. 2 is transmitted to the comparison determination circuit 8d. The spectrum data for the source current signal, which is obtained when the test pattern TP is supplied to a normal LSI for T seconds, are stored, as comparison data, in the memory 9. The comparison determination circuit 8d compares the comparison data with the source current spectrum A and determines whether the two match. When the two match, it is ascertained that the DUT 2 is normal, and when the two do not match, it is ascertained that a failure has occurred at the DUT 2. In this manner, a DUT 2 failure is detected.

The present applicant proposed, prior to this invention, an LSI testing system with which the measurement time required for the detection of a DUT 2 failure can be reduced (the Japanese Patent Application No. Hei 10-240822), and failure detection mode (1) corresponds to this previously proposed LSI testing system, with which a test pattern can be applied to a DUT a plurality of times. In use, a test pattern is applied to the DUT 2 one time or a plurality of times, and a source current obtained for the DUT 2 is thereafter converted into spectrum data. Then, the spectrum obtained for a DUT 2 in the normal state is compared with a spectrum obtained for one in an abnormal state, and the difference is employed for the detection of a failure.

Failure Detection Mode (2)

In the same manner as is described above, test pattern A is applied to the input/output terminal I/O of the DUT 2 for T seconds, and the measured source current value is transmitted unchanged to the comparison determination circuit 8d via only the signal converter 8a. In this case, source current signal A in FIG. 2 is transmitted to the comparison determination circuit 8d. Waveform data for the source current signal, which is obtained when test pattern TP is supplied to a normal LSI for T seconds, are stored as comparison data in the memory 9. The comparison determination circuit 8d compares the comparison data with source current signal A, and determines whether the two match. In this manner, a DUT 2 failure is detected.

Failure Detection Mode (3)

A source current signal, such as source current signal A, for one test pattern is affected by a measurement system, so that it more or less fluctuates. Especially when the DUT 2 is a CMOS integrated circuit, substantially no current flows across the circuit when it is inactive, so that the circuit tends to be affected by noise, and for each measurement, the strength of the source current varies. And since no particular measurement is taken for the LSI testing system according to failure detection mode (1) or (2) or the conventional LSI testing system, the measured values for them also vary. In this failure detection mode, therefore, the affect of the fluctuation of the source current is removed in the following manner to reduce measurement variances in the detection of a DUT 2 failure.

First, the supply of a source voltage by the power generator 3a, and the generation of a test pattern are begun. As is indicated by test pattern B in FIG. 3, test pattern TP is applied to the input/output terminal I/O of the DUT 2 three times, each time for T seconds. Simultaneously, the source current for the DUT 2 is generated by the source current measurement circuit 3b, and the obtained source current value is transmitted via the signal converter 8a to the averaging processor 8b.

Figure 3:
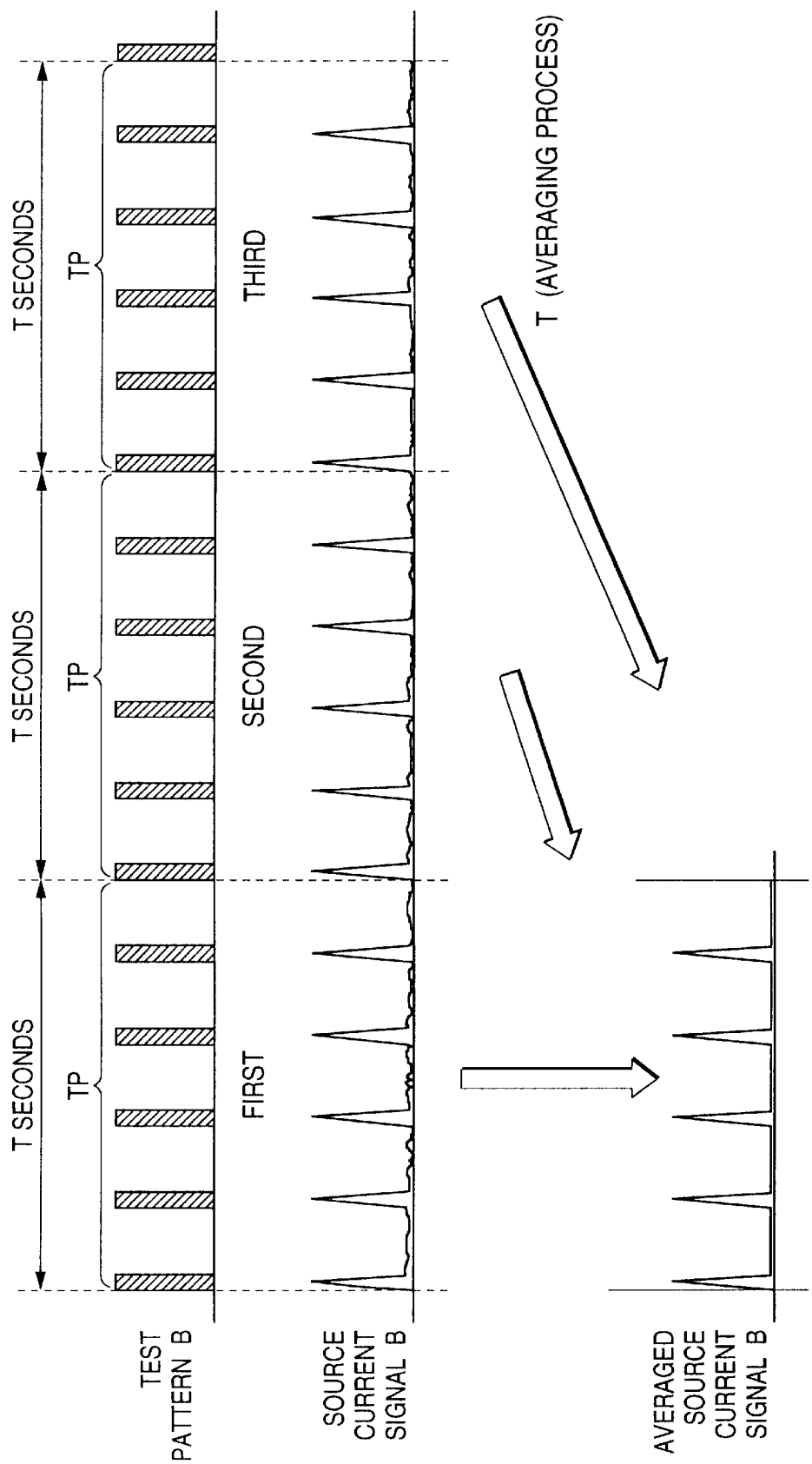
FIG. 3 is a diagram showing test pattern TP that is repetitively supplied to the DUT 2 by the LSI testing system, a generated source current waveform for the DUT, and an averaged source current waveform.

Then, source current signal B in FIG. 3, which is T seconds long, is transmitted to the averaging processor 8b. Although the waveform of the source current signal B represents a source current when the same test pattern is repetitively applied, the waveform is accompanied by a slight fluctuation that differs for each test pattern.

Therefore, the averaging processor 8b averages such a source current signal. That is, the averaging processor 8b adds together three source current signal waveforms, corresponding to the first to the third test patterns (adds the current values obtained at individual times during the T seconds for the individual source current signals), divides the obtained signal waveform by three (divides, by three, the current values obtained at separate times), and generates a source current signal following the averaging processing. As a result, the source current signal (hereinafter referred to as an averaged current signal), such as the averaged source current signal B in FIG. 3, which corresponds to T seconds and for which the averaging process has been completed, can be obtained.

Thereafter, the averaged current signal is transmitted to the signal analyzer 8c, where it is converted into spectrum data that are transmitted to the comparison determination circuit 8d. In this failure detection mode, the spectrum data for the source current signal, which is obtained when the test pattern TP for T seconds is supplied to the normal LSI, are stored as comparison data in the memory 9. The comparison determination circuit 8d compares the comparison data with the spectrum data obtained by converting the averaged current signal, and determines whether the two match. In this manner, a DUT 2 failure is detected.

Failure Detection Mode (4)

While in failure detection mode (3) the averaged current signal is converted into the spectrum data by the signal analyzer 8c, the averaged current signal may also be transmitted unchanged to the comparison determination circuit 8d, without the spectrum conversion being performed. That is, as well as in failure detection mode (3), test pattern B is applied to the input/output terminal I/O for 3T seconds, and the measured source current value is transmitted via the signal converter 8a to the averaging processor 8b. After the averaging process has been performed, the resultant signal is transmitted to the comparison determination circuit 8d. In this case, since the averaged source current signal B in FIG. 3 is transmitted unchanged to the comparison determination circuit 8d, the waveform data of the source current signal, which is obtained when the test pattern TP is applied to the normal LSI, are stored as comparison data in the memory 9. The comparison determination circuit 8d compares the comparison data with the averaged source current signal B, and determines whether the two match. As a result, a DUT 2 failure is detected in the same manner.

As is described above, in the LSI testing system 1, the spectrum analyzation unit 8 includes the averaging processor 8b that implements the averaging processing function. Further, in order to reduce the effect of the fluctuation of the current, the LSI testing system applies a test pattern to the DUT 2 a plurality of times, performs averaging processing, converts the obtained signal into spectrum data, and employs the spectrum data to determine whether the DUT 2 is normal. That is, in failure detection modes (3) or (4) of the LSI testing system 1, the same test pattern is repetitively applied and the averaging processor 8b provides an average for the digital signals that are obtained by the signal converter 8a. Thereafter, the averaged signal is converted by the signal analyzer 8c into spectrum data, and the spectrum data, or the digital signal obtained by the averaging process, are employed by the comparison determination circuit 8d to detect a failure. Thus, the source current waveform generated upon the application of a test pattern to the DUT 2 corresponds to the averaged source current signal B in FIG. 3 from which fluctuation has been removed. Therefore, the effect produced by the current fluctuation due to the arrangement of the measurement system can be reduced, and uniform and precise failure detection, having little variance, can be conducted.

Failure Detection Mode (5)

An explanation will now be given for a mode for employing an extremely small source current spectrum to detect a failure. First, the supply of a source voltage by the power generator 3a and the generation of a test pattern by the pattern generator 4 are begun, and test pattern C in FIG. 4, wherefor the same test patterns TP are coupled together, is transmitted to the input/output terminal I/O. At this time, a source current for the DUT 2 is generated by the source current measurement circuit 3b, and the measured source current value is transmitted via the signal converter 8a to the signal analyzer 8c. There, the current value is changed into spectrum data, which are transmitted to the comparison determination circuit 8d.

Figure 4:
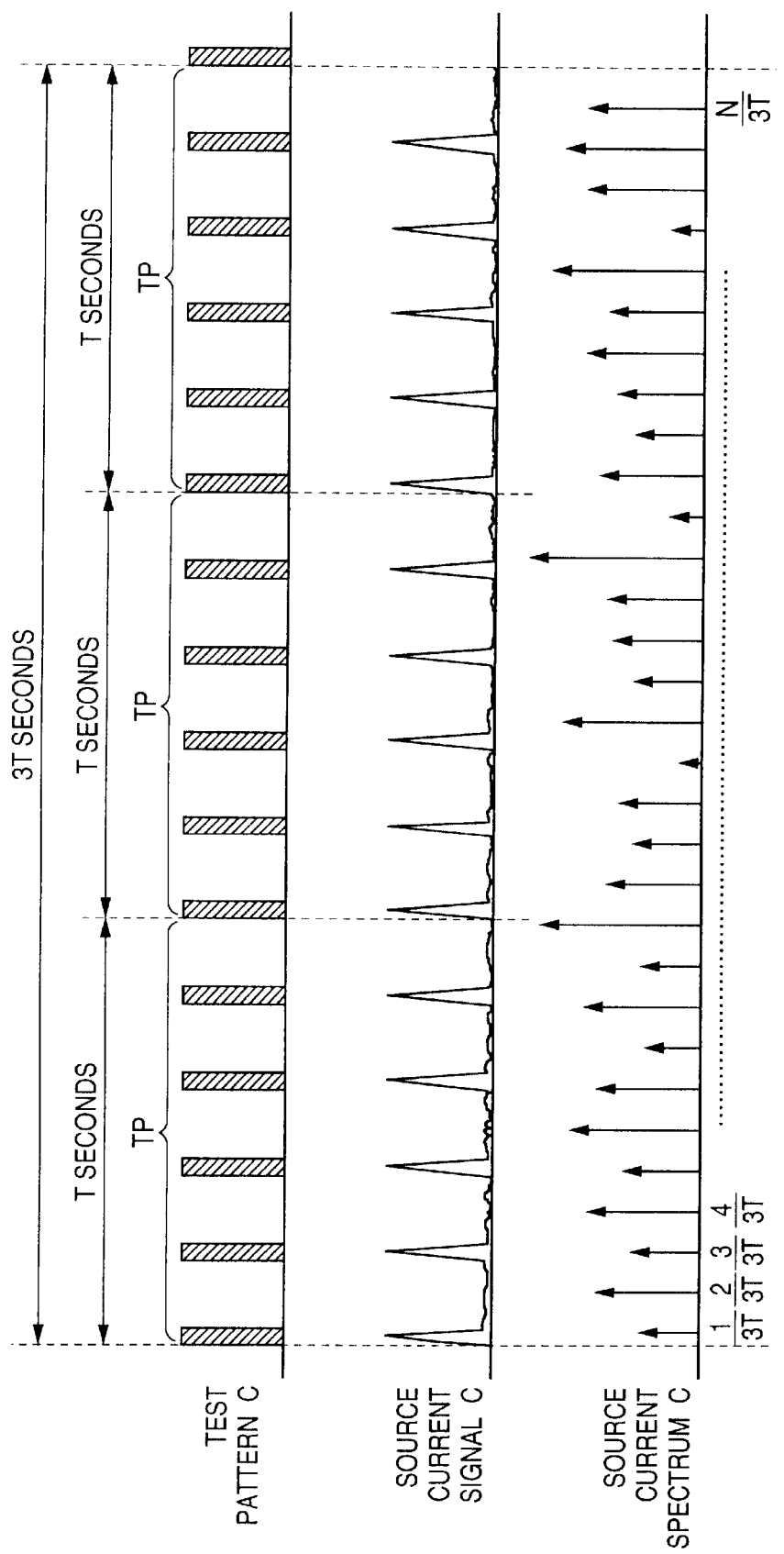
FIG. 4 is a diagram showing test pattern TP that is repetitively supplied to the DUT by the LSI testing system, and a generated source current waveform for the DUT 2 and its spectrum.

As a result, source current signal C in FIG. 4 is transmitted to the signal analyzer 8c, and source current spectrum C in FIG. 4 is transmitted to the comparison determination circuit 8d. In this failure detection mode, the spectrum data for the source current signal, which is obtained when three of the same test patterns TP are linked together and supplied to the normal LSI, are stored as comparison data in the memory 9. The comparison determination circuit 8d compares the comparison data with the source current spectrum C, and determines whether the two match. As a result, a DUT 2 failure is detected.

As is described for failure detection mode (1), the source current waveform obtained when only test pattern TP for T seconds is supplied to the DUT 2 corresponds to source current signal A in FIG. 2. When the waveform is converted into spectrum data and the source current spectrum for the DUT 2 is generated, source current spectrum A in FIG. 2 is obtained. In the source current spectrum A, a spectrum is generated at a frequency of 1/T [Hz], and thereafter spectra are generated at frequencies of 2/T [Hz], 3/T [Hz], ..., which are integer times a basic frequency of 1/T [Hz].

In failure detection mode (5), the test pattern linking function of the pattern generator 4 connects three of the same test patterns TP together and supplies them to the DUT 2. Thus, the source current spectrum for the DUT 2 in FIG. 4 can be generated. Since three of the same test patterns TP are linked together, and since for each of the test patterns TP to reach its full run term T seconds are required, the total run time for the linked test patterns is 3T seconds. Thus, when the obtained source current waveform (source current signal C) is converted into spectrum data, the source current spectrum for the DUT 2 is source current spectrum C, and the spectrum is generated at a frequency of 1/3T [Hz]. Thereafter, spectra are generated at frequencies of 2/3T [Hz], 3/3T [Hz], ..., which are integer times a smaller basic frequency of 1/3T [Hz].

Specifically, in failure detection mode (1), during the period in which the test pattern is running, the spectrum can be generated only at a frequency of 1/T [Hz]. In failure detection mode (5), however, wherein the same test patterns are linked together, the frequency interval at which the spectrum can be generated is smaller. Therefore, a measurement using an extremely small source current spectrum can be conducted, and the rate of detection of DUT 2 failures can be increased. In the LSI testing system 1, since the pattern generator 4 links together a plurality of test patterns, for each of which the pattern running time required is T seconds, and transmits them to the DUT 2, the spectrum can be analyzed at an interval of 1/NT (N being the number of linked patterns), and the failure detection rate can be enhanced.

Failure Detection Mode (6)

In failure detection mode (5), three of the same test patterns TP are linked together and supplied to the DUT 2, and the source current spectrum is generated. However, the function of the averaging processor 8*b* may be employed to generate the source current spectrum. That is, test pattern C, which is obtained by linking together three test patterns TP, is repetitively supplied to the DUT 2 three times (here, the pattern generator 4 generates a total of nine test patterns TP). The three source current signals C, obtained at separate times, are transmitted to the averaging processor 8*b*, which thereafter performs the above described averaging processing.

Therefore, an averaged current signal corresponding to 3T seconds is obtained, and the averaged current signal is converted into spectrum data by the signal analyzer 8*c*. Then, in the same manner as is described above, the comparison determination circuit 8*d* determines whether the spectrum data match the comparison data. Thus, since the current fluctuation due to the structure of the measurement system is eliminated, and since the spectrum for a source current signal having at a small frequency interval is obtained and can be employed for comparison, uniform and appropriate failure detection, having little variance, can be performed and a high failure detection rate can be achieved.

Three of the same test patterns are linked together in failure detection modes (3) to (6); however, the number of linked patterns is merely an example, and an arbitrary number of like test patterns can be employed. Further, the source current signals A to C and the source current spectra A and C and the averaged source current signal B, which have waveforms in FIG. 4, are merely examples; these signals are not limited to those shown in FIG. 4. In addition, in failure detection modes (3) and (4), in which a source current signal for 3T seconds is not employed for conversion into a spectrum, the same test patterns are not always linked together, and only three source current signals for the same T second test pattern need be obtained.

As is described above, according to the invention the same test pattern is supplied to a device being tested a plurality of times; a source current for the device is measured each time the test pattern is supplied; and the obtained average source current is employed to detect a failure. Thus, the fluctuation of a measured source current is eliminated from the process for the detection of a failure. And therefore, variances in the measurements performed to detect and analyze failures occurring in a device being tested can be reduced, and uniform and precise measurements can be obtained. According to the second aspect of the invention, the averaged source current is converted into a spectrum, which is employed to detect a failure occurring in the device being tested. Therefore, measurements that vary less can be obtained by using the spectrum for the source current from which fluctuation has been eliminated.

According to the third aspect of the invention, a plurality of the same patterns are connected together and are supplied to a device being tested, and a source current for the device that is obtained when the connected test patterns are supplied is measured and converted into a spectrum, which is then employed to detect a failure in the device being tested. Therefore, a spectrum can be obtained at a frequency interval that is smaller than when only one test pattern is supplied, and can be employed to detect a failure. As a result, the measurement using an extremely small source current spectrum can be conducted, and the detection rate for failures occurring in a device being tested can be enhanced.

According to the fourth aspect of the invention the connected test patterns are supplied to the device being tested a plurality of times, and an average is obtained for the source currents that are measured each time the test patterns are supplied. The averaged source current is thereafter converted into a spectrum, which is then employed to detect a failure occurring in the device that is being tested. Thus, current fluctuation is removed, and a spectrum having a small frequency interval can be used to detect a failure. Therefore, uniform and appropriate failure detection can be performed for which there is less variance, and a high failure detection rate can be achieved.

According to the fifth aspect of the invention, in a device testing system, which comprises various units and is used to detect failures in devices being tested, the averaging processing function is implemented by the provision of the averaging circuit, which repetitively supplies the same test pattern to a device being tested, and which averages the source currents obtained for the device so that variances in the measurements can be reduced. According to the sixth aspect of the invention, a function is provided for converting, into spectral data, data obtained by the averaging circuit. Thus, following the repetitive application of the same test pattern, the source currents obtained for a device being tested are averaged, and the averaged source current is converted into spectrum data that are employed for the detection of a failure. In this fashion, variances in measurements can be reduced.

According to the seventh aspect of the invention, in order to detect a failure occurring in a device being tested, a plurality of the same test patterns can be connected together and applied to the device. As a result, the failure detection rate can be increased. For example, when three test patterns, each of which requires T seconds to run, are linked together, since the run time for each test pattern is the same, the time required to run the three test patterns is 3T seconds. When the source current for the DUT that is obtained during the 3T seconds is converted into spectrum data, a spectrum is generated at 1/3T, and other spectra are generated at frequencies of 2/3T [Hz], 3/3T [Hz], . . . , which are integer times the basic frequency of 1/3T [Hz]. As is described above, since the same test patterns are linked together and supplied to the DUT, the spectrum that is conventionally generated at an interval of 1/T can be generated at an interval of 1/NT (N is the number of linked patterns). As a result, the detection rate for DUT failures can be improved.

What is claimed is:

1. A device testing system comprising:
    pattern supply means for supplying the same test pattern a plurality of times to a device being tested;
    measurement means for measuring a source current for said device each time the test pattern is supplied;
    averaging means for averaging the obtained values to provide an average source current measurement; and
    detection means for detecting a failure of said device based on the average source current provided by said averaging means.

2. The device testing system according to claim 1, wherein
    said detection means converts the average source current into a spectrum, and employs the spectrum to detect the failure of said device being tested.

3. A device testing system comprising:
    pattern supplying means for supplying to a device being tested a plurality of like patterns that are linked together;
    measurement means for measuring a source current for said device when the linked test patterns are supplied; and
    detection means for converting into a spectrum the source current measured by said measurement means, and for employing the spectrum to detect a failure in said device being tested; and wherein said pattern supplying means includes:
    test pattern supply means for supplying the linked test patterns to said device being tested;
    averaging means for providing an average source current that is obtained by using the source currents that are measured by said measurement means when the test patterns are supplied; and wherein
    said detection means converts, into a spectrum, the average source current obtained by said averaging means, and employs the spectrum to detect a failure of said device being tested.

4. A device testing system, which is used to detect a failure of a device being tested, comprising:
    a unit having a source current measurement function;
    a unit for generating a test pattern and for controlling the test pattern;
    a unit for converting, into spectral data, information for a source current for said device being tested;
    means for repetitively applying the same test pattern to said device being tested; and
    averaging means for averaging the source current obtained for said device.

5. The device testing system according to claim 4, further comprising:
    a unit for converting, into spectral data, data obtained by said averaging circuit.

6. The device testing system according to claim 5, wherein
    a plurality of the same test patterns are linked together and applied to said device being tested in order to detect a failure.

* * * * *